United States Patent
Yeh

(10) Patent No.: US 10,102,121 B1
(45) Date of Patent: Oct. 16, 2018

(54) MEMORY MANAGEMENT METHOD, MEMORY CONTROL CIRCUIT UNIT AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/649,655

(22) Filed: Jul. 14, 2017

(30) Foreign Application Priority Data

May 19, 2017 (TW) .............................. 106116591 A

(51) Int. Cl.
*G06F 12/06* (2006.01)
*G06F 12/02* (2006.01)

(52) U.S. Cl.
CPC ...... *G06F 12/0646* (2013.01); *G06F 12/0246* (2013.01); *G06F 2212/7205* (2013.01)

(58) Field of Classification Search
CPC ............. G06F 12/0646; G06F 12/0246; G06F 2212/7205
See application file for complete search history.

(56) References Cited

U.S. PATENT DOCUMENTS

2017/0154656 A1* 6/2017 Yeh ...................... G06F 3/0679

OTHER PUBLICATIONS

Soojun Im and Dongkun Shin. Storage architecture and software support for SLC/MLC combined flash memory. In Proceedings of the 2009 ACM symposium on Applied Computing (SAC '09). ACM, New York, NY, USA, 1664-1669. (Year: 2009).*

* cited by examiner

*Primary Examiner* — Ramon A. Mercado
(74) *Attorney, Agent, or Firm* — JCIPRNET

(57) ABSTRACT

A memory management method, a memory control circuit unit and a memory storage device are provided. The method includes: configuring a plurality of first type super physical units and at least one second type super physical unit, where one first type super physical unit includes at least two available physical erasing units which may be programmed simultaneously, and one second type super physical unit includes at least two available physical erasing units which may not be programmed simultaneously. The method also includes: configuring the first type super physical unit as to be programmed based on a first programming mode or a second programming mode, and configuring the second type super physical unit as to be programmed only based on the first programming mode.

24 Claims, 13 Drawing Sheets

MEMORY MANAGEMENT METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 106116591, filed on May 19, 2017. The entirety of the above-mentioned patent application is hereby incorporated by reference herein and made a part of this specification.

BACKGROUND

Technical Field

The present invention relates to a memory management method, and more particularly, relates to a memory management method, a memory control circuit unit and a memory storage device for a rewritable non-volatile memory module.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, the rewritable non-volatile memory module is controlled by one memory control circuit unit. The memory control circuit unit can receive data from a host system, and write the data into the rewritable non-volatile memory module. In certain configurations, the rewritable non-volatile memory module has a plurality of planes, and each of the planes includes a plurality of physical erasing units. The memory control circuit unit can configure the physical erasing units belonging to different planes as the same super physical unit, and the memory control circuit unit can program the physical erasing units in the same super physical unit alternately or simultaneously. Accordingly, a speed for writing data into the rewritable non-volatile memory module may be increased when what issued by the host system is the sequential data.

However, each plane of the rewritable non-volatile memory module may include available physical erasing units and bad physical erasing units, and the memory control circuit unit may only use the available physical erasing units in each plane to configure the super physical unit. If each plane includes a different number of the bad physical erasing units, each plane may then include an unequal number of the available physical erasing units. Under such circumstance, remaining available physical erasing units not configured as the super physical unit will exist in the plane having more available physical erasing units, and thereby influences the size of the actual usable storage space. Therefore, it has become one of the major subjects for person skilled in the art as how to fully utilize the available physical erasing units to configure the super physical unit in order to improve usage rate of the physical erasing units.

Furthermore, according to some memory storage device specifications, it is configured that multiple open blocks operated in the TLC (Trinary Level Cell) mode cannot exist in the same plane at the same time. For example, in the TLC storage system, if multiple available physical erasing units in the same plane are configured as one super physical unit, then the subsequent operation for this super physical unit may encounter problems. Therefore, it is also concerned about how to get balance between the usage rate of physical erasing units and system compatibility.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory management method, a memory control circuit unit and a memory storage device, which are capable of configuring a plurality of physical erasing units belonging to the same plane as the same super physical unit, and configuring the physical erasing unit belonging to the same super physical unit to be only operated in specific programming mode, so as to get balance between the usage rate of physical erasing units and system compatibility.

An exemplary embodiment of the present invention provides a memory management method for a memory storage device. The memory storage device has a rewritable non-volatile memory module, and the rewritable non-volatile memory module has a plurality of available physical erasing units. The memory management method includes: allocating a part of the available physical erasing units for configuring a plurality of first type super physical units. Herein, each of the first type super physical units at least includes a first available physical erasing unit and a second available physical erasing unit, and the first available physical erasing unit and the second available physical erasing unit are simultaneously programmed. The memory management method also includes: allocating another part of the available physical erasing units for configuring at least one second type super physical unit. One of the at least one second type super physical unit at least includes a third available physical erasing unit and a fourth available physical erasing unit, and the third available physical erasing unit is programmed before the fourth available physical erasing unit is programmed. The memory management method further includes: configuring each available physical erasing unit of the first type super physical units to be programmed based on one of a first programming mode and a second programming mode; and configuring each available physical erasing unit of the at least one second type super physical unit to be programmed only based on the first programming mode, wherein each memory cell of one available physical erasing unit programmed based on the first programming mode is configured to store a first number of data bit, each memory cell of one available physical erasing unit programmed based on the second programming mode is configured to store a second number of data bit, and the second number is larger than the first number.

An exemplary embodiment of the present invention provides a memory control circuit unit, which is configured to control a rewritable non-volatile memory module. The rewritable non-volatile memory module includes a plurality of available physical erasing units. The memory control circuit unit includes a host interface, a memory interface and a memory management circuit. The host interface is coupled to a host system. The memory interface is coupled to the rewritable non-volatile memory module. The memory management circuit is coupled to the host interface and the memory interface. The memory management circuit is configured to allocate a part of the available physical erasing units for configuring a plurality of first type super physical units. Herein, each of the first type super physical units at least includes a first available physical erasing unit and a second available physical erasing unit, and the first available physical erasing unit and the second available physical erasing unit are simultaneously programmed. The memory management circuit is further configured to allocate another part of the available physical erasing units for configuring at least one second type super physical unit. One of the at least one second type super physical unit at least includes a third available physical erasing unit and a fourth available physical erasing unit, and the third available physical erasing unit is programmed before the fourth available physical erasing unit is programmed. Furthermore, the memory management circuit is further configured to configure each available physical erasing unit of the first type super physical units to be programmed based on one of a first programming mode and a second programming mode and configure each available physical erasing unit of the at least one second type super physical unit to be programmed only based on the first programming mode, wherein each memory cell of one available physical erasing unit programmed based on the first programming mode is configured to store a first number of data bit, each memory cell of one available physical erasing unit programmed based on the second programming mode is configured to store a second number of data bit, and the second number is larger than the first number.

An exemplary embodiment of the present invention provides a memory storage device, which includes a connection interface unit, a rewritable non-volatile memory module and aforesaid memory control circuit unit. The connection interface unit is coupled to a host system. The memory control circuit unit is coupled to the connection interface unit and the rewritable non-volatile memory module.

Based on the above, the memory management method, the memory control circuit unit and the memory storage device as proposed in exemplary embodiments of the present invention are capable of configuring multiple available physical erasing units belonging to the same plane as the same super physical unit, so as to increase the usage rate of the physical erasing units. On the other hand, through configuring multiple available physical erasing units included in the same super physical unit belonging to the same plane as to be programmed only based on specific programming mode, the system compatibility based on aforesaid configuration can be improved.

To make the above features and advantages of the present disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
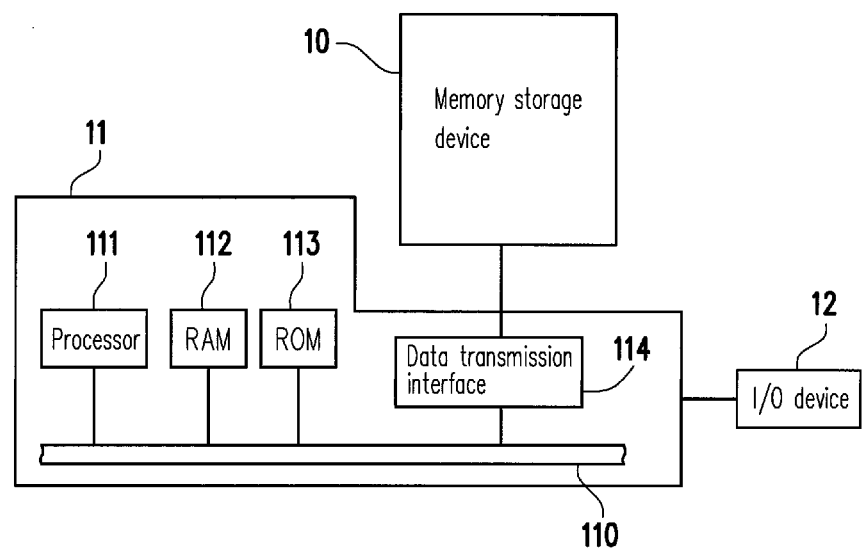
FIG. 1 is a schematic diagram illustrating a host system, a memory storage device and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit unit). The memory storage device is usually configured together with a host system so that the host system may write data into the memory storage device or read data from the memory storage device.

Figure 2:
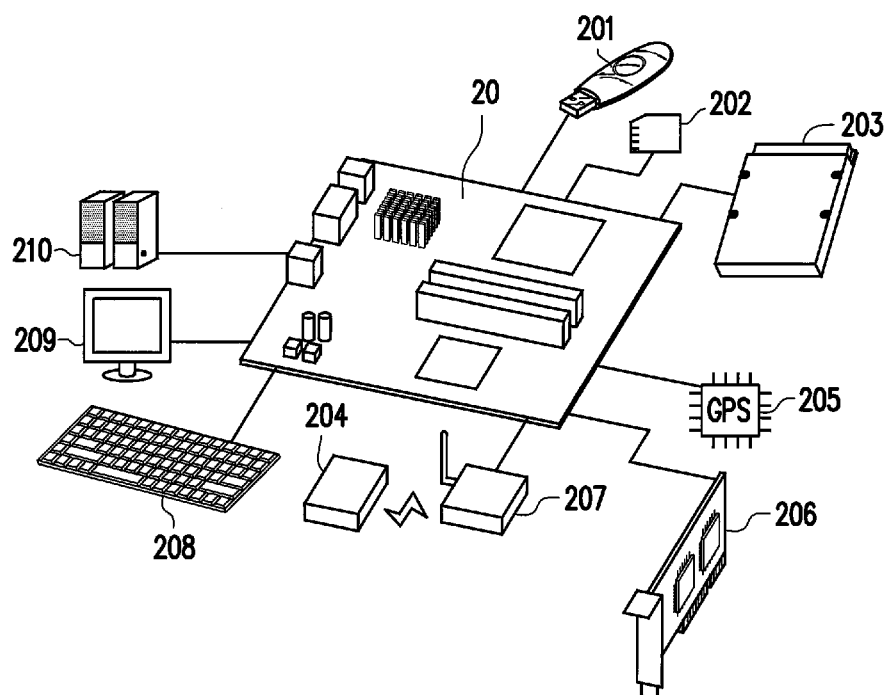
FIG. 2 is a schematic diagram illustrating a host system, a memory storage device and an input/output (I/O) device according to another exemplary embodiment.

FIG. 1 is a schematic diagram illustrating a host system, a memory storage device and an input/output (I/O) device according to an exemplary embodiment. FIG. 2 is a schematic diagram illustrating a host system, a memory storage device and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can write data into the memory storage device 10 or read data from the memory storage device 10 through the data transmission interface 114. Further, the host system 111 is coupled to an I/O device 12 through the system bus 110. For example, the host system 11 can transmit output signals to the I/O device 12 or receive input signals from I/O device 12 through the system bus 110.

In this exemplary embodiment, the processor 111, the RAM 112, the ROM 113 and the data transmission interface 114 are disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication Storage) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 through the wireless transmission device 207.

Figure 3:
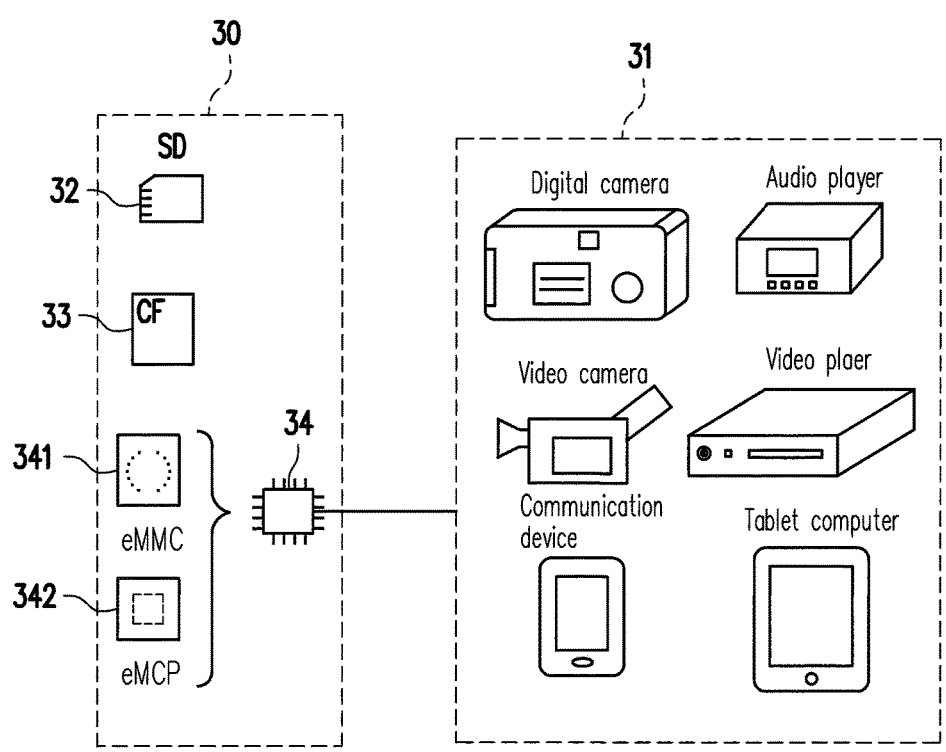
FIG. 3 is a schematic diagram illustrating a host system and a memory storage device according to another exemplary embodiment.

In an exemplary embodiment, aforementioned host system may be any systems capable of substantially cooperating with the memory storage device for storing data. Although the host system is illustrated as a computer system in foregoing exemplary embodiment, however, FIG. 3 is a schematic diagram illustrating a host system and a memory storage device according to another exemplary embodiment. Referring to FIG. 3, in another exemplary embodiment, a host system 31 may also be a system including a digital camera, a video camera, a communication device, an audio player, a video player or a tablet computer, whereas a memory storage device 30 can be various non-volatile memory devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
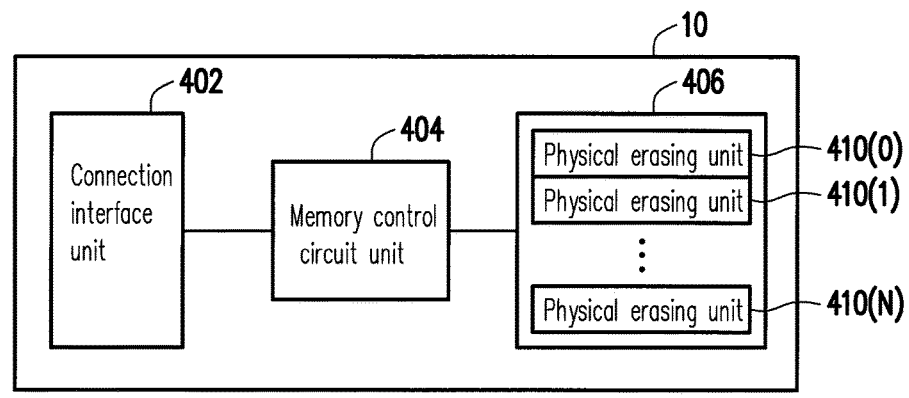
FIG. 4 is a schematic block diagram illustrating a host system and a memory storage device according to an exemplary embodiment.

FIG. 4 is a schematic block diagram illustrating a host system and a memory storage device according to an exemplary embodiment.

Referring to FIG. 4, the memory storage device 10 includes a connection interface unit 402, a memory control circuit unit 404 and a rewritable non-volatile memory module 406.

In this exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In this exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control instructions which are implemented in form of hardware or firmware, so as to execute operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes a plurality of physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the present invention is not limited thereto. Each physical erasing unit may be composed by 64 physical programming units, 256 physical programming units or any number of the physical programming units.

More specifically, the physical erasing unit is the minimum unit for erasing. Namely, each physical erasing unit contains the least number of memory cells to be erased together. The physical programming unit is the minimum unit for programming. That is, the physical programming unit is the minimum unit for writing data. The physical programming unit usually includes a data bit area and a redundancy bit area. The data bit area having multiple physical access addresses is used to store user data, and the redundant bit area is used to store system data (e.g., control information and error checking and correcting code). In this exemplary embodiment, each data bit area of the physical programming unit contains 8 physical access addresses, and the size of each physical access address is 512 bytes. However, in other exemplary embodiments, the data bit area may also include more or less of the physical access addresses, and the size and the number of the physical access addresses are not limited in the present invention. For example, in an exemplary embodiment, the physical erasing unit is a physical block, and the physical programming unit is a physical page or a physical sector, but the present invention is not limited thereto.

In this exemplary embodiment, each of the physical erasing units 410(0) to 410(N) belongs to one of a plurality of operation units. The physical erasing units belonging to different operation units may be programmed alternately or simultaneously. For instance, the operation unit may be a channel, a chip, a die or a plane. More specifically, in an exemplary embodiment, the memory storage device 10 includes a plurality of channels, and the memory control circuit unit 404 accesses different parts of the physical erasing units 410(0) to 410(N) through different channels. The physical erasing units on the different channels may operate independently. For instance, while the memory control circuit unit 404 is executing a writing operation on the physical erasing units on one channel, the memory control circuit unit 404 can simultaneously execute a reading operation or other operations on the physical erasing units on another channel. In the memory storage device 10, the physical erasing units in the same channel may belong to different chips. In an exemplary embodiment, the physical erasing units belonging to different chips also belong to different interleaves. After the physical erasing units in a specific chip are programmed, the memory control circuit unit 404 may continue to program the physical erasing units in the next chip without waiting for a ready signal replied from the specific chip. In the rewritable non-volatile memory module 406, the physical erasing units in the same interleave may also belong to different planes. In the same interleave, the physical erasing units belonging to different planes may be simultaneously programmed according to the same write command.

In an exemplary embodiment, the memory storage device 10 includes one channel and one chip, and such chip includes two planes, but the invention is not limited thereto. In another exemplary embodiment, the memory storage device 10 may also include n channels, m interleaves, and k planes. Herein, n, m and k are positive integers, and at least one of the positive integers is greater than 1 (i.e., the memory storage device 10 includes a plurality of operation units). However, values of the positive integers n, m and k are not particularly limited in the present invention.

In this exemplary embodiment, the rewritable non-volatile memory module 406 is a MLC (Multi Level Cell) NAND flash memory module (i.e., a flash memory module capable of storing two data bits in one memory cell). However, the present invention is not limited thereto. The rewritable non-volatile memory module 406 may also be a SLC (Single Level Cell) NAND flash memory module, (i.e., a flash memory module capable of storing one data bit in one memory cell), a TLC (Trinary Level Cell) NAND flash memory module (i.e., a flash memory module capable of storing three data bits in one memory cell), other flash memory modules or any memory module having the same features.

Figure 5:
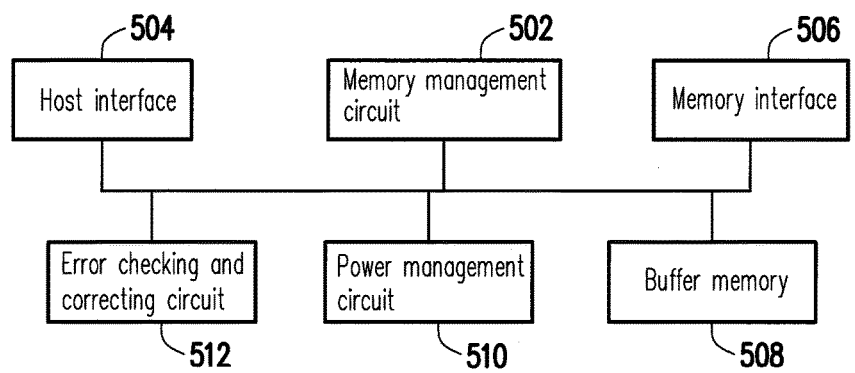
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504, a memory interface 506, a buffer memory 508, a power management circuit 510, and an error checking and correcting circuit 512.

The memory management circuit 502 is configured to control overall operations of the memory control circuit unit 404. Specifically, the memory management circuit 502 has a plurality of control instructions. During operations of the memory storage device 10, the control instructions are executed to execute various operations such as writing, reading and erasing data. In the following description, the operation of the memory management circuit 502 equals to the operation of the memory control circuit unit 404.

In this exemplary embodiment, the control instructions of the memory management circuit 502 are implemented in form of firmware. For instance, the memory management circuit 502 has a microprocessor unit (not illustrated) and a read-only memory (not illustrated), and the control instructions are burnt into the read-only memory. During the operations of the memory storage device 10, the control instructions are executed by the microprocessor to perform operations of writing, reading or erasing data.

In another exemplary embodiment of the invention, the control instructions of the memory management circuit 502 may also be stored into a specific area (for example, a system area in the memory module exclusively used for storing the system data) of the rewritable non-volatile memory module 406 as program codes. In addition, the memory management circuit 502 has a microprocessor unit (not illustrated), a ROM (not illustrated) and a RAM (not illustrated). Particularly, the ROM has a boot code, which is executed by the microprocessor unit to load the control instructions stored in the rewritable non-volatile memory module 406 to the RAM of the memory management circuit 502 when the memory control circuit unit 404 is enabled. Thereafter, the control instructions are executed by the microprocessor unit to execute operations of writing, reading or erasing data.

Further, in another exemplary embodiment, the control instructions of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 504 is coupled to the memory management circuit 502 and configured to couple to the connection interface unit 402, so as to receive and identify commands and data sent from the host system 11. In other words, the commands and the data sent from the host system 11 are passed to the memory management circuit 502 through the host interface 504. In this exemplary embodiment, the host interface 504 is compatible with the SATA standard. However, it should be understood that the present invention is not limited thereto, and the host interface 504 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted to a format acceptable to the rewritable non-volatile memory module 406 through the memory interface 506. Specifically, if the memory management circuit 502 intends to access the rewritable non-volatile memory module 406, the memory interface 506 transmits corresponding command sequences. For example, the command sequences may include the write command sequence which instructs to write data, the read command sequence which instructs to read data, the erase command sequence which instructs to erase data, and the read voltage control command sequences which indicates a read voltage level for reading data, and the type of the command sequences able to be transmitted by the memory interface 506 is not limited to the above. These command sequences are generated by the memory management circuit 502 and transmitted to the rewritable non-volatile memory module 406 through the memory interface 506, for example. The command sequences may include one or more signals, or data on the bus. The signals or the data may include command codes and programming codes. For example, in a read command sequence, information such as identification codes and memory addresses are included.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control a power of the memory storage device 10.

The error checking and correcting circuit 512 is coupled to the memory management circuit 502 and configured to execute an error checking and correcting process to ensure the correctness of data. Specifically, when the memory management circuit 502 receives a write command from the host system 11, the error checking and correcting circuit 512 generates an ECC code (Error Checking and Correcting Code) for data corresponding to the write command, and the memory management circuit 502 writes the data corresponding to the write command and the corresponding ECC code into the rewritable non-volatile memory module 406. Subsequently, when the memory management circuit 502 reads the data from the rewritable non-volatile memory module 406, the ECC code corresponding to the data is also read, and the error checking and correcting circuit 512 may execute the error checking and correcting procedure for the read data according to the ECC code.

Figure 6:
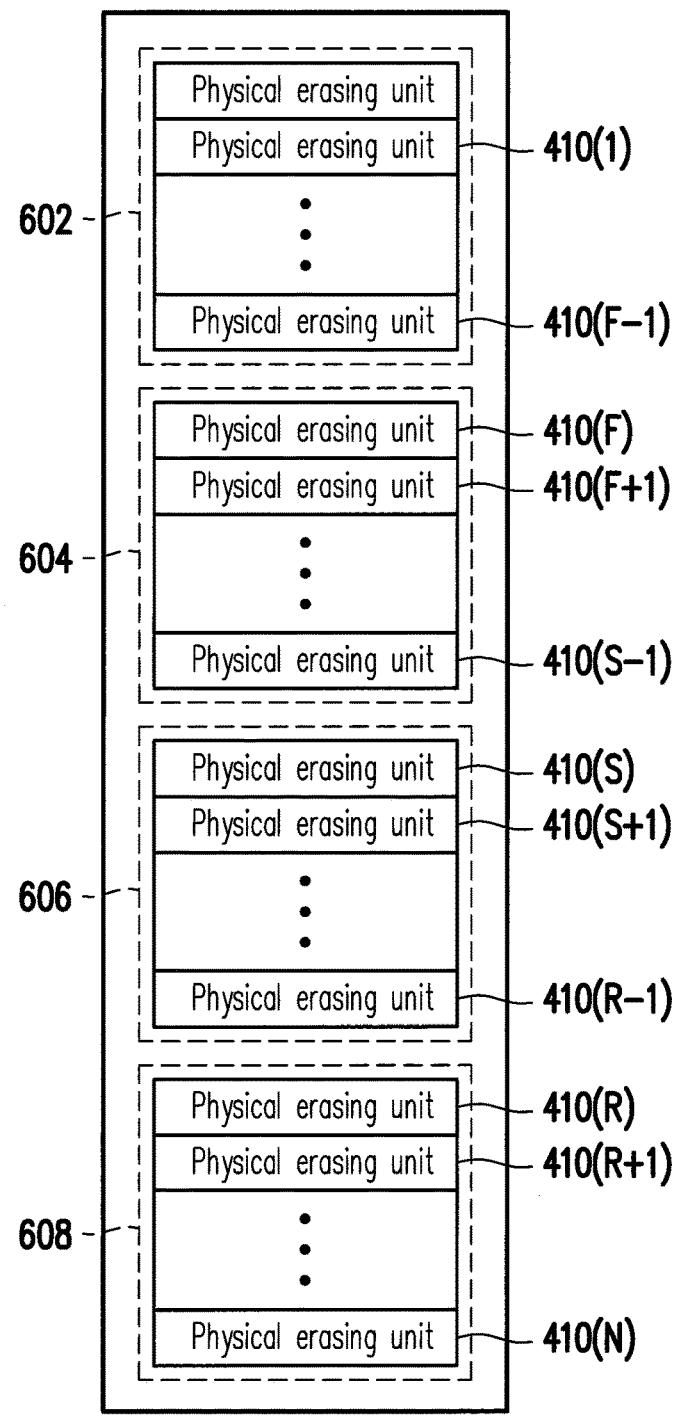
FIG. 6 and FIG. 7 are schematic diagrams illustrating a management of the physical erasing units according to an exemplary embodiment.
Figure 7:
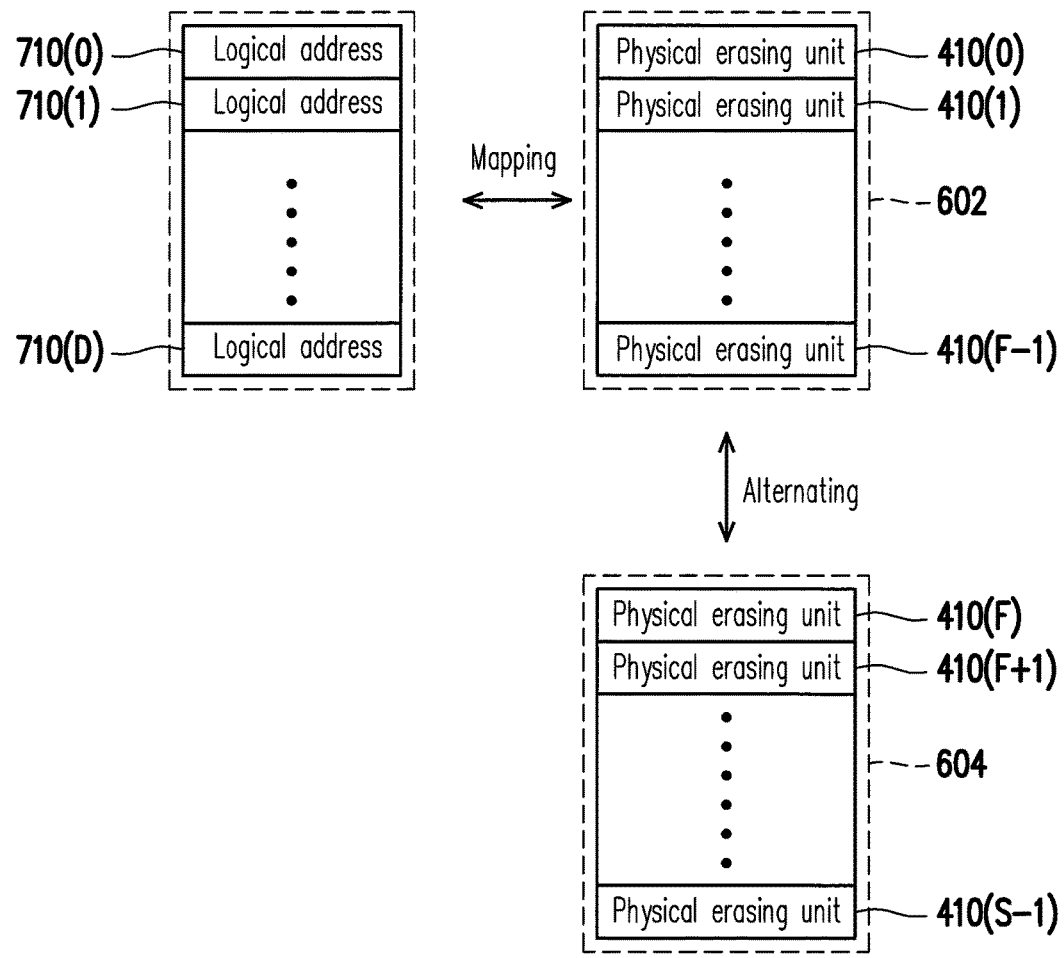

FIG. 6 and FIG. 7 are schematic diagrams illustrating a management of the physical erasing units according to an exemplary embodiment.

It should be understood that terms, such as "select", "group", "divide", "associate" and so forth, are logical concepts which describe operations in the physical erasing units of the rewritable non-volatiles memory module 406. That is to say, rather than changing actual positions of the physical units of the rewritable non-volatile memory module, the physical erasing units of the rewritable non-volatile memory module are logically operated.

Referring to FIG. 6, the memory management circuit 502 may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with data, whereas the physical erasing units of the spare area 604 are configured to replace the physical erasing units of the data area 602. In other words, when the write command and the data to be written are received from the host system 11, the memory management circuit 502 selects the physical erasing units from the spare area 604, and writes the data into the selected physical erasing units in order to replace the physical erasing units in the data area 602.

The physical erasing units logically belonging to the system area 606 are configured to record system data. For example, the system data includes information related to manufacturer and model of the rewritable non-volatile memory module, the number of physical erasing units in the rewritable non-volatile memory module, the number of the physical programming units in each physical erasing unit, and so forth.

The physical erasing units logically belonging to the replacement area 608 are used in a bad physical erasing unit replacement procedure for replacing damaged physical erasing units. More specifically, if normal physical erasing units are still available in the replacement area 608 and the physical erasing units of the data area 602 are damaged, the memory management circuit 502 selects the normal physical erasing units from the replacement area 608 for replacing the damaged physical erasing units.

Particularly, the numbers of the physical erasing units in the data area 602, the spare area 604, the system area 606 and the replacement area 608 may be different from one another according to the different memory specifications. In addition, it should be understood that, during operations of the memory storage device 10, grouping relations of the physical erasing units for associating with the data area 602, the spare area 604, the system area 606, and the replacement area 608 may be dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 7, as described above, the physical erasing units of the data area 602 and the spare area 604 are configured for storing data written from the host system 11 in an alternating manner. In this exemplary embodiment, the memory management circuit 502 allocates logical addresses 710(0) to 710(D) to the host system 11 for mapping physical erasing units 414(0) to 410(F-1) in the data area 602, so as to facilitate data accessing in the physical erasing units stored with data in said alternating manner. Particularly, the host system 11 accesses the data in the data area 602 through the logical addresses 710(0) to 710(D). In this exemplary embodiment, one logical address is mapped to one physical sector, a logical programming unit is constituted by multiple logical addresses, and a logical erasing unit is constituted by multiple logical programming units.

Further, the memory management circuit 502 establishes a logical-physical mapping table to record a mapping relation between the logical addresses and the physical erasing units. In this exemplary embodiment, the memory management circuit 502 manages the rewritable non-volatile memory module 406 by the logical programming units. Therefore, one logical-physical mapping table is established by the memory management circuit 502 for recording a mapping relation between the logical programming units and the physical programming units. In another exemplary embodiment, the memory management circuit 502 manages the rewritable non-volatile memory module 406 by the logical erasing units. Therefore, one logical-physical mapping table is established by the memory management circuit 502 for recording a mapping relation between the logical erasing units and the physical erasing units.

In this exemplary embodiment, the memory management circuit 502 configures a plurality of super physical units, and each of the super physical units includes at least two physical erasing units. The memory management circuit 502 uses the super physical unit to store data. For example, when the host system issues a write command, the memory management circuit 502 selects one super physical unit to program data. The memory management circuit 502 can configure two different types of the super physical units including a first type super physical unit and a second type super physical unit. At least two physical erasing units in one first type super physical unit belong to different operation units (e.g., belong to different planes or dies) and may be programmed simultaneously or alternately. At least two physical erasing units in one second type super physical unit will not be programmed simultaneously. Further, among the physical erasing units included by one second type super physical unit, at least two physical erasing units belong to the same plane or die. In an example where one super physical unit includes four physical erasing units, the four physical erasing units of one first type super physical unit all belong to different planes or dies. However, the four physical erasing units of one second type super physical unit may all belong to the same plane or die. Alternatively, two physical erasing units (or three physical erasing units) may belong to the same plane or die while the other physical erasing units may belong to different planes or dies.

It is noted that in the following description, some terms may be replaced with corresponding abbreviations for ease of reading (see Table 1).

TABLE 1

| rewritable non-volatile memory module | RNVM module |
|---|---|
| physical erasing unit | PEU |
| physical programming unit | PPU |
| super physical unit | SPU |
| logical erasing unit | LEU |
| logical programming unit | LPU |
| memory management circuit | MMC |

Figure 8A:
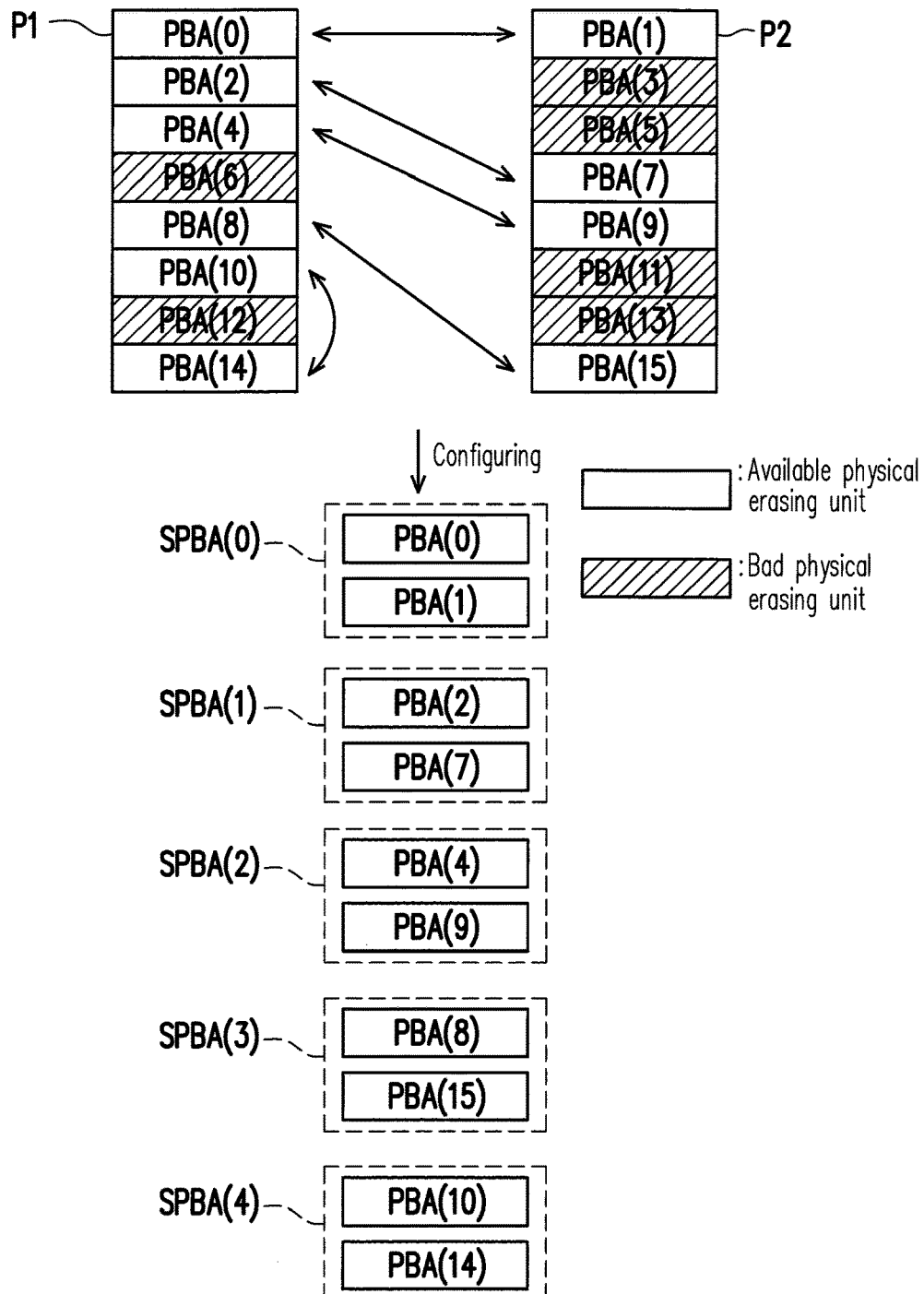
FIG. 8A is a schematic diagram illustrating an example for configuring the super physical unit according to an exemplary embodiment.

FIG. 8A is a schematic diagram illustrating an example for configuring the SPU according to an exemplary embodiment. In this exemplary embodiment, it is assumed that each SPU includes two PEUs.

Referring to FIG. 8A, the following description takes the plane for example and assumes that the RNVM module 406 includes two planes P1 and P2, and each of the planes P1 and P2 includes eight PEUs. The plane P1 includes two bad PEU (i.e., PEUs PBA(6) and PBA(12) depicted by dashed lines), and the plane P2 includes four bad PEUs (i.e., PEUs PBA(3), PBA(5), PBA(11) and PBA(13) depicted by dashed lines). In other words, the number of the available PEUs in the plane P1 is 6 and the number of the available PEUs in the plane P2 is 4. In this exemplary embodiment, the MMC 502 first configures the first type SPUs. In other words, the MMC 502 selects one available PEU from each of the planes P1 and P2 for configuring one first type SPU. For instance, the MMC 502 configures an available PEU PBA(0) belonging to the plane P1 and an available PEU PBA(1) belonging to the plane P2 as a first type SPU SPBA(0). By analogy, the MMC 502 can configure the first type SPUs SPBA(0) to SPBA(3), and two available PEUs included by each of these first type SPUs belong to the planes P1 and P2, respectively.

In this exemplary embodiment, because one first type SPU is configured by two PEUs belonging to the different planes, the number of the first SPUs configurable by the MMC 502 is at most equal to the number of the available PEUs in the plane having less available PEUs. As described above, the number of the available PEUs in the plane P1 is 6 and the number of the available PEUs included by the plane P2 is 4. In other words, the number of the available PEUs included by the plane P2 is less than the number of the available PEUs included by the plane P1. Therefore, the number of the first type SPUs configurable by the MMC 502 is at most equal to the number of the available PEUs included by the plane P2 (i.e., four first type SPUs may be configured at most). Accordingly, after the largest number of the first type SPUs are configured, the available PEUs which may not be configured as the first type SPUs will be present in the plane having more available PEUs.

On that basis, the MMC 502 configures the second type SPUs, and each of the second type SPUs includes two PEUs belonging to the same plane. As shown in FIG. 8A, because the plane P1 has more available PEUs than the plane P2, available PEUs PBA(10) and PBA(14) which may not be configured as the first type SPU will be present in the plane P1 after the largest number of the first type SPUs are configured. The MMC 502 configures the available PEUs PBA(10) and PBA(14) as one second type SPU SPBA(4). As such, the available PEUs in the planes P1 and P2 may all be configured as the SPUs.

In this exemplary embodiment, one LEU is mapped to one SPU (i.e., one LEU is mapped to multiple PEUs). As described above, a product of said positive integers n, m and k represents the number of PEUs in one SPU, namely, the product represents the number of the PEUs mapped to one LEU. In the exemplary embodiments of FIGS. 8B and 8C below, the positive integer n is 1, the positive integer m is 1, and the positive integer k is 2. In other words, one LEU is mapped to two different PEUs.

When the host system 11 issues the write command, if the corresponding write data is to be programmed into one first type SPU, the MMC 502 divides the write data into multiple parts and programs these parts into the different PEUs of such first type SPU, respectively. Therefore, in one first type SPU, multiple different PEUs mapped to the same LEU belong to the different planes, and one LPU is mapped to multiple PPUs belonging to the different PEUs. As a result, the writing speed may be increased accordingly.

Figure 8B:
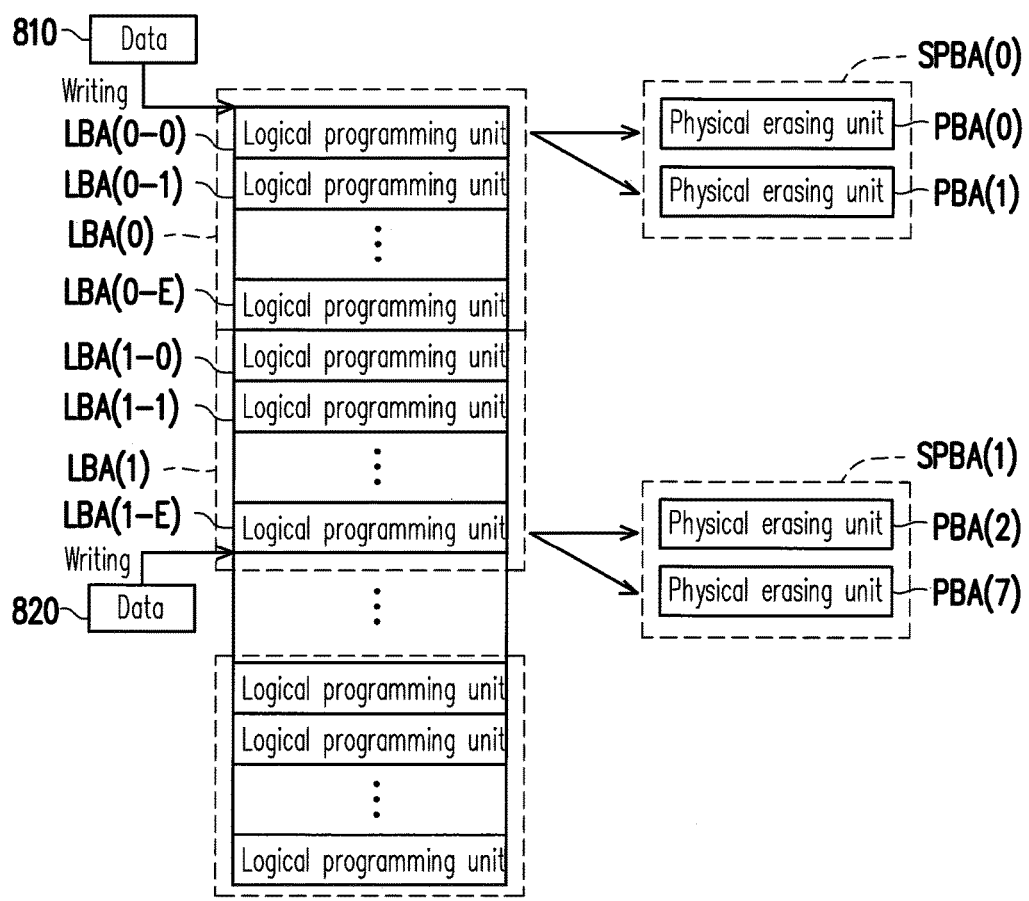
FIG. 8B is a schematic diagram illustrating an example for writing the data into the first type super physical unit according to the exemplary embodiment of FIG. 8A.

FIG. 8B is a schematic diagram illustrating an example for writing the data into the first type SPU according to an exemplary embodiment.

Referring to FIG. 8B, a LEU LBA(0) is mapped to the first type SPU SPBA(0), and the LEU LBA(0) includes LPUs LBA(0-0) to LBA(0-E). If a capacity of one PPU is 4 KB (kilobyte), a capacity of one LPU is 8 KB. The host system 11 issues one write command which indicates to write data 810 into the LPU LBA(0-0). Assuming that the size of the data 810 is 8 KB, the MMC 502 divides the data 810 into two parts (i.e., a first part and a second part), where the size of each part is 4 KB. Herein, the logical address to which the second part belongs is arranged after the logical address to which the first part belongs. After the write command is received, the MMC 502 issues at least one command sequence to write the first part of the data 810 into the PEU PBA(0) and simultaneously writes the second part of the data 810 into the PEU PBA(1).

In this exemplary embodiment, if the host system 11 further issues other write commands, the MMC 502 writes the data indicated by said other write commands into the PEUs PBA(0) and PBA(1) until there is no spare PPU left in the PEUs PBA(0) and PBA(1). Next, if the MMC 502 receives one write command which indicates to write data 820, the MMC 502 writes the data 820 into the first type SPU SPBA(1). For instance, the LEU LBA(1) is mapped to the first type SPU SPBA(1), and the LEU LBA(1) includes LPUs LBA(1-0) to LBA(1-E). The data 820 is to be written into the LPU LBA(1-E), and the size of the data 820 is 8 KB. As similar to the data 810 being divided into the two parts, the MMC 502 also divides the data 820 into two parts, where the size of each part is 4 KB. The MMC 502 writes the first part of the data 820 into the PEU PBA(2) and simultaneously writes the second part of the data 820 into the PEU PBA(7).

On the other hand, when the host system 11 issues the write command, if the corresponding write data is to be programmed into one second type SPU, the MMC 502 can program the write data into one of the PEUs in such second type SPU in an exemplary embodiment. The MMC 502 programs the corresponding write data into another PEU of such second type SPU only when said one of the PEUs is fully written (i.e., there is no spare PPU left). In other words, the MMC 502 programs at least part of the write data into one PEU in the second type SPU first, and then programs the other part of write data into another PEU of the same second type SPU only when such PEU is fully written. Further, in this exemplary embodiment, in one second type SPU, the two different PEUs mapped by one LEU belong to the same plane.

Figure 8C:
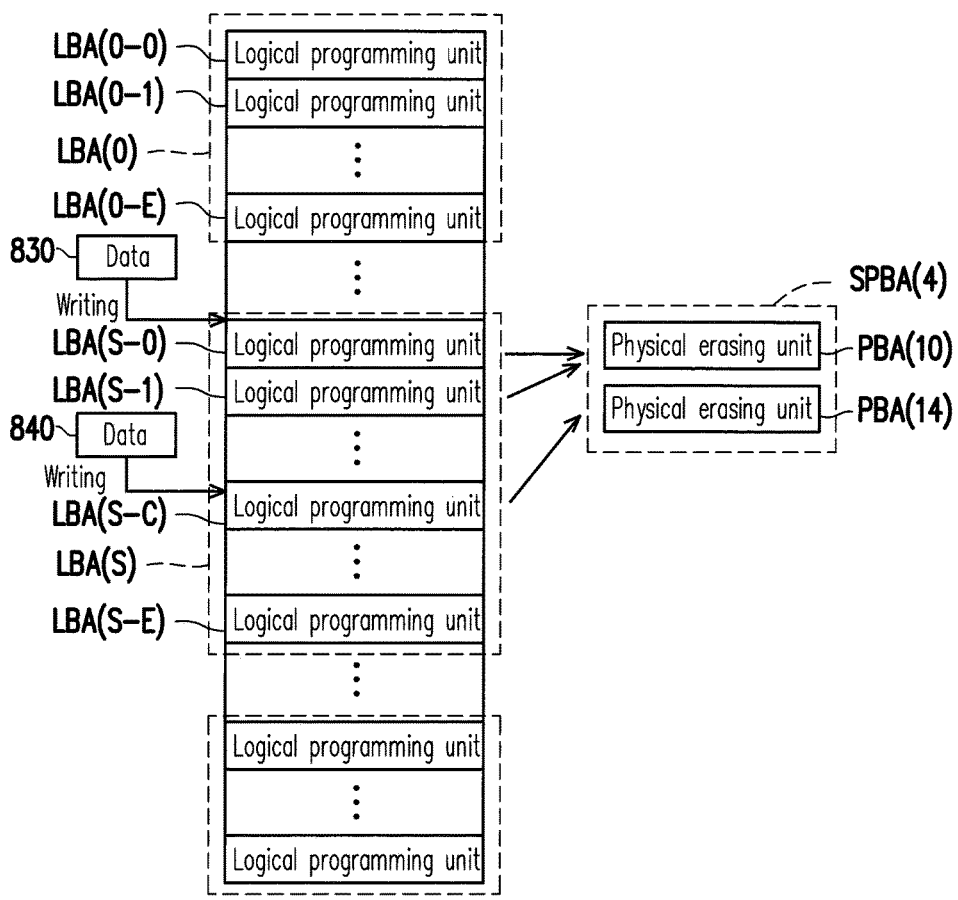
FIG. 8C is a schematic diagram illustrating an example for writing the data into the second type super physical unit according to the exemplary embodiment of FIG. 8A.

FIG. 8C is a schematic diagram illustrating an example for writing the data into the second type SPU according to an exemplary embodiment.

Referring to FIG. 8C, a LEU LBA(S) is mapped to the second type SPU SPBA(4), and the LEU LBA(S) includes LPUs LBA(S-0) to LBA(S-E). It is assumed that one LPU is mapped to multiple PPUs in the same PEU. As described above, the capacity of one PPU is 4 KB, and the capacity of one LPU is 8 KB. The host system 11 issues one write command which indicates to write data 830 into the LPU LBA(S-0). The MMC 502 programs the data 830 into the PEU PBA(10) of the second type SPU SPBA(4). For example, it is assumed herein that the size of the data 830 is 8 KB. In an exemplary embodiment, the MMC 502 issues at least one command sequence to program a first part of the data 830 into a first PPU of the PEU PBA(10) and writes a second part of the data 830 into a second PPU of the PEU PBA(10). Herein, the logical address to which the second part of the data 830 belongs is arranged after the logical address to which the first part of the data 830 belongs. Specifically, the MMC 502 programs the received write data into the PPUs of the PEU PBA(10) according to an arrangement sequence of the PPUs of the PEU PBA(10). In other words, after the programming of one PPU of the PEU PBA(10) is completed, the programming of the next PPU of the PEU PBA(10) is executed.

As described above, the MMC 502 programs the data into one PEU of the second type SPU in a manner of one PPU after another PPU. In this exemplary embodiment, if the host system 11 further issues other write commands, the MMC 502 first writes the data indicated by said other write commands into the PEU PBA(10) until there is no spare PPU left in the PEU PBA(10). Next, if the MMC 502 receives one write command which indicates to write data 840, the MMC 502 writes the data 840 into the PEU PBA(14) of the second type SPU SPBA(4). For instance, the data 840 is to be written into the LPU LBA(S-C), and the size of the data 840 is 8 KB. Because there is no spare PPU left in the PEU PBA(10), the MMC 502 sequentially programs the data 840 into a first PPU and a second PPU in the PEU PBA(14) of the second type SPU SPBA(4).

It is worth mentioning that, in the exemplary embodiment of FIG. 8C, the MMC 502 can program the write data into the second type SPU by using a cache program writing operation method. For example, the MMC 502 can first temporarily store the write data into a buffer area of the buffer memory 508 and reply a confirmation message to the host system 11 to notify the host system 11 that the write command is completed and the next write command may be issued. Thereafter, the write data is programmed from the buffer area of the buffer memory 508 into the second type SPU. For example, when a data quantity of the data temporarily stored in the buffer area reaches a threshold, an operation of programming the data in the buffer area into the second type SPU may be executed. Therefore, the MMC 502 can complete the programming of one PEU in a second type SPU and then execute the programming of another PEU in the same second type SPU by using the cache program writing operation method.

However, in another exemplary embodiment, the multiple PEUs of the second type SPU may be programmed alternately. Taking FIG. 8C for example, it is assumed that one LPU is mapped to multiple PPUs in the different PEUs. When the write command which indicates to write the data 830 into the LPUs LBA(S-0) is received, the MMC 502 can issue at least one command sequence to program the first part of the data 830 into a first PPU of the PEU PBA(10) of the SPU SPBA(4). Then, after the programming of the first PPU of the PEU PBA(10) is completed, the second part of the data 830 is programmed into a first PPU of the PEU PBA(14) of the SPU SPBA(4). By analogy, the MMC 502 alternately programs the subsequently received write data into the PEU PBA(10) and the PEU PBA(14) of the SPU SPBA(4). For example, when the write command which indicates to write the data 840 into the LPUs LBA(S-C) is received, the MMC 502 also issues at least one command sequence to program the first part of the data 840 into one PPU of the PEU PBA(10) of the SPU SPBA(4). After the programming of the PPU of the PEU PBA(10) is completed, the second part of the data 840 is programmed into another PPU of the PEU PBA(14) of the SPU SPBA(4). In other words, the MMC 502 alternately programs the data into the second type SPU in a manner of one PPU of one PEU after another PPU of another PEU.

Figure 9A:
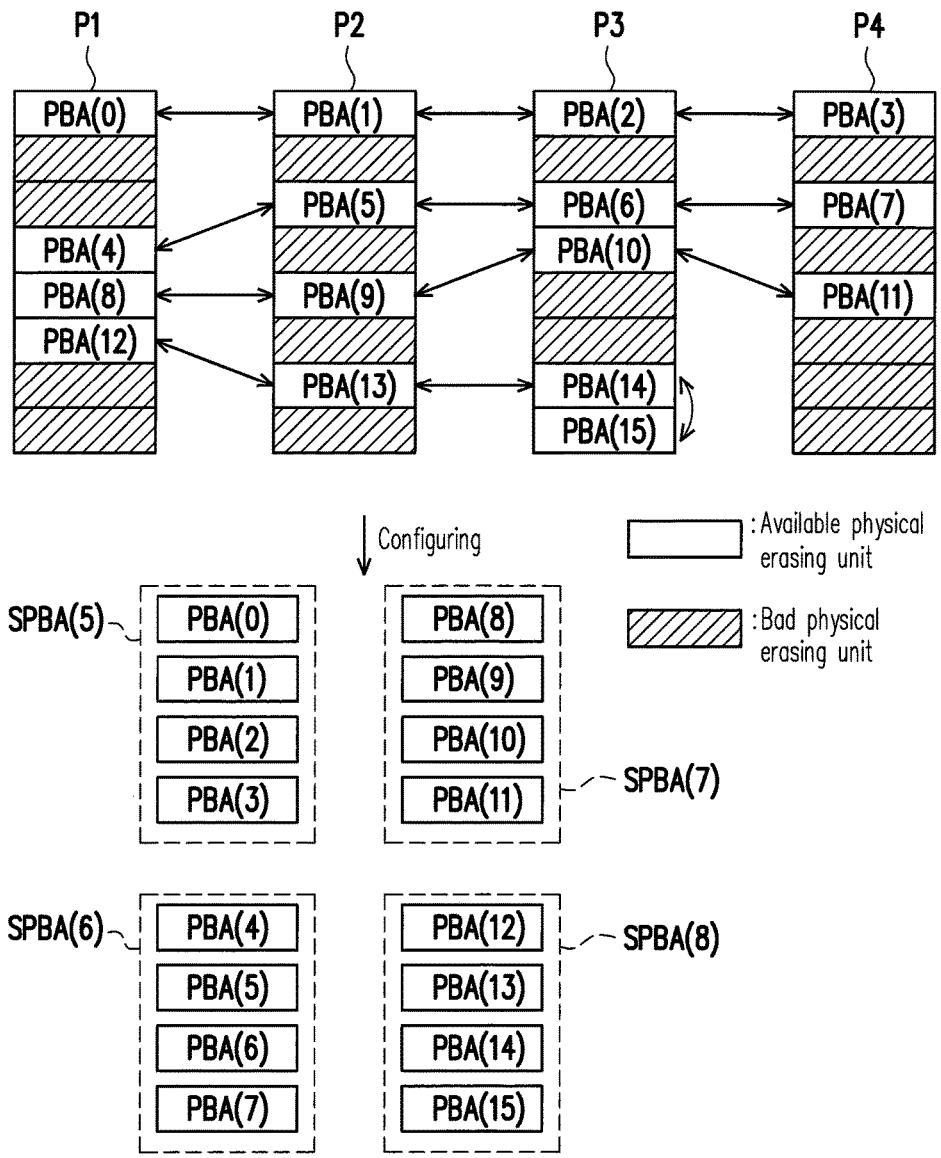
FIG. 9A is a schematic diagram illustrating an example for configuring the super physical unit according to another exemplary embodiment.

FIG. 9A is a schematic diagram illustrating an example for configuring the SPU according to another exemplary embodiment. Unlike FIG. 8A, in this exemplary embodiment, it is assumed that each SPU includes four PEUs.

Referring to FIG. 9A, it is assumed that the RNVM module 406 includes four planes P1, P2, P3 and P4, and each of the planes P1, P2, P3 and P4 includes eight PEUs. As described above, the MMC 502 uses the available PEUs in each plane to configure the SPUs. In this exemplary embodiment, the MMC 502 selects one available PEU from each of the planes P1, P2, P3 and P4 for configuring one first type SPU. For instance, the MMC 502 configures an available PEU PBA(0) belonging to the plane P1, an available PEU PBA(1) belonging to the plane P2, an available PEU PBA(2) belonging to the plane P3 and an available PEU PBA(3) belonging to the plane P4 as a first type SPU SPBA(5), and the rest may deduced by analogy. In this exemplary embodiment, since the plane P4 only includes three available PEUs, the MMC 502 can only configure three first type SPUs SPBA(5), SPBA(6) and SPBA(7) at most, and four available PEUs included by each of the first type SPUs belong to the planes P1, P2, P3 and P4, respectively.

After the largest number of the first type SPUs are configured, the available PEUs which may not be configured as the first type SPUs are still present in the planes P1, P2 and P3. Each of the planes P1 and P2 includes one remaining available PEU (i.e., PEUs PBA(12) and PBA(13)) while the plane P3 includes two remaining available PEUs (i.e., PEUs PBA(14) and PBA(15)). On the basis, the MMC 502 configures the remaining four available PEUs as one second type SPU. As shown in FIG. 9A, the MMC 502 configures the available PEU PBA(12) belonging to the plane P1, the available PEU PBA(13) belonging to the plane P2 and the available PEUs PBA(14) and PBA(15) belonging to the plane P3 as a second type SPU SPBA(8).

In this exemplary embodiment, the four available PEUs included by the second type SPU SPBA(8) belong to the planes P1, P2 and P3, respectively. In other words, the second type SPU SPBA(8) includes at least two available PEUs which belong to the same plane.

As described above, a product of said positive integers n, m and k represents the number of PEUs in one SPU, namely, the product represents the number of the PEUs mapped to one LEU. In the exemplary embodiments of FIGS. 9B and 9C below, the positive integer n is 1, the positive integer m is 2, and the positive integer k is 2. In other words, one LEU is mapped to four different PEUs. Further, to simplify the description, in the exemplary embodiments of FIGS. 9B and 9C, it is assumed that the capacity of one PPU is 4 KB and the capacity of one LPU is 16 KB.

Figure 9B:
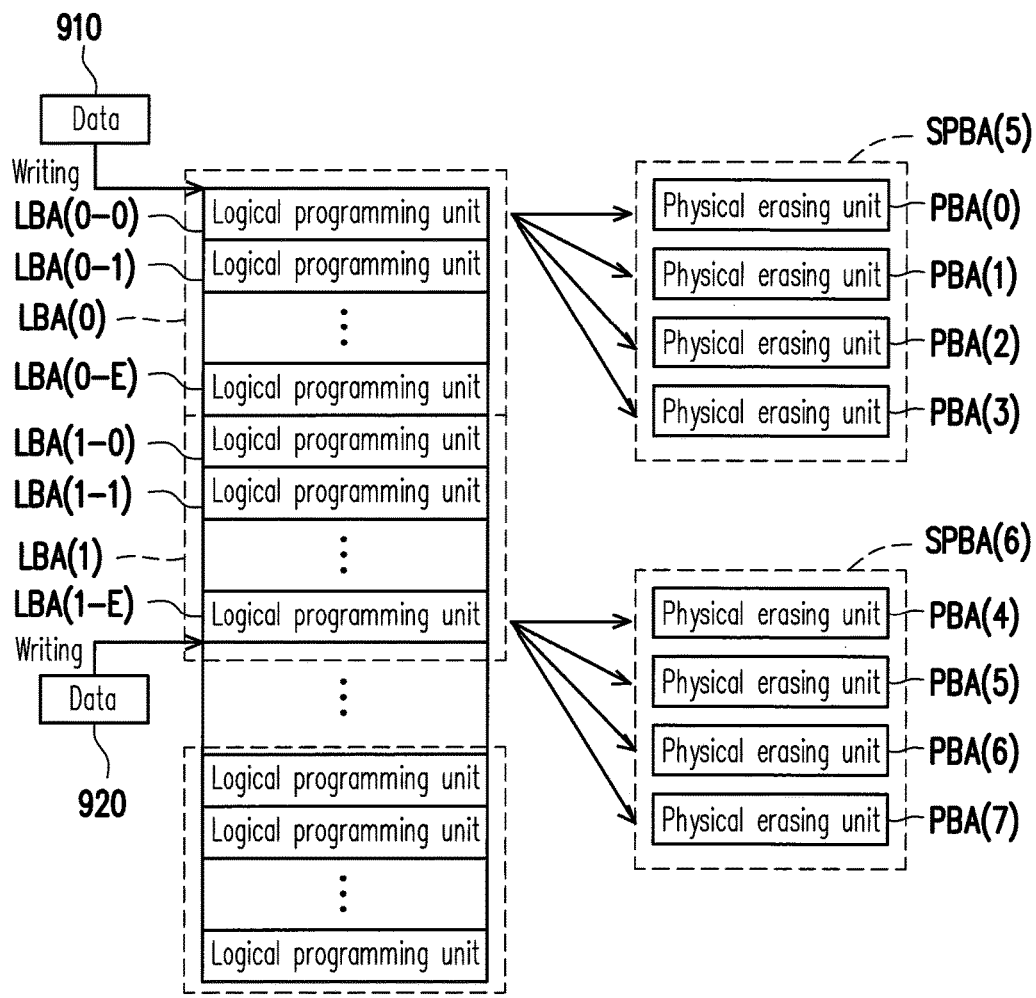
FIG. 9B is a schematic diagram illustrating an example for writing the data into the first type super physical unit according to the exemplary embodiment of FIG. 9A.

FIG. 9B is a schematic diagram illustrating an example for writing the data into the first type SPU according to the exemplary embodiment of FIG. 9A.

Because the available PEUs in the first type SPU belong to the different planes, the MMC 502 programs the write data into the first type SPU by the same method as described in the exemplary embodiment of FIG. 8B.

Referring to FIG. 9B, the LEU LBA(0) is mapped to the first type SPU SPBA(5). The host system 11 issues a write command which indicates to write data 910 into the LPU LBA(0-0). It is assumed herein that the size of the data 910 is 16 KB. The MMC 502 divides the data 910 into four parts, where the size of each part is 4 KB. After the write command is received, the MMC 502 simultaneously writes the four parts of the data 910 into the PEUs PBA(0), PBA(1), PBA(2) and PBA(3) of the first type SPU SPBA(5), respectively. When the MMC 502 receives one write command which indicates to write data 920, if there is no spare PPU in the PEUs PBA(0), PBA(1), PBA(2) and PBA(3) of the first type SPU SPBA(5), the MMC 502 writes the data 920 into the first type SPU SPBA(6). The method of writing the data into the first type SPU has been described in the exemplary embodiment of FIG. 8B, which is not repeated hereinafter.

Figure 9C:
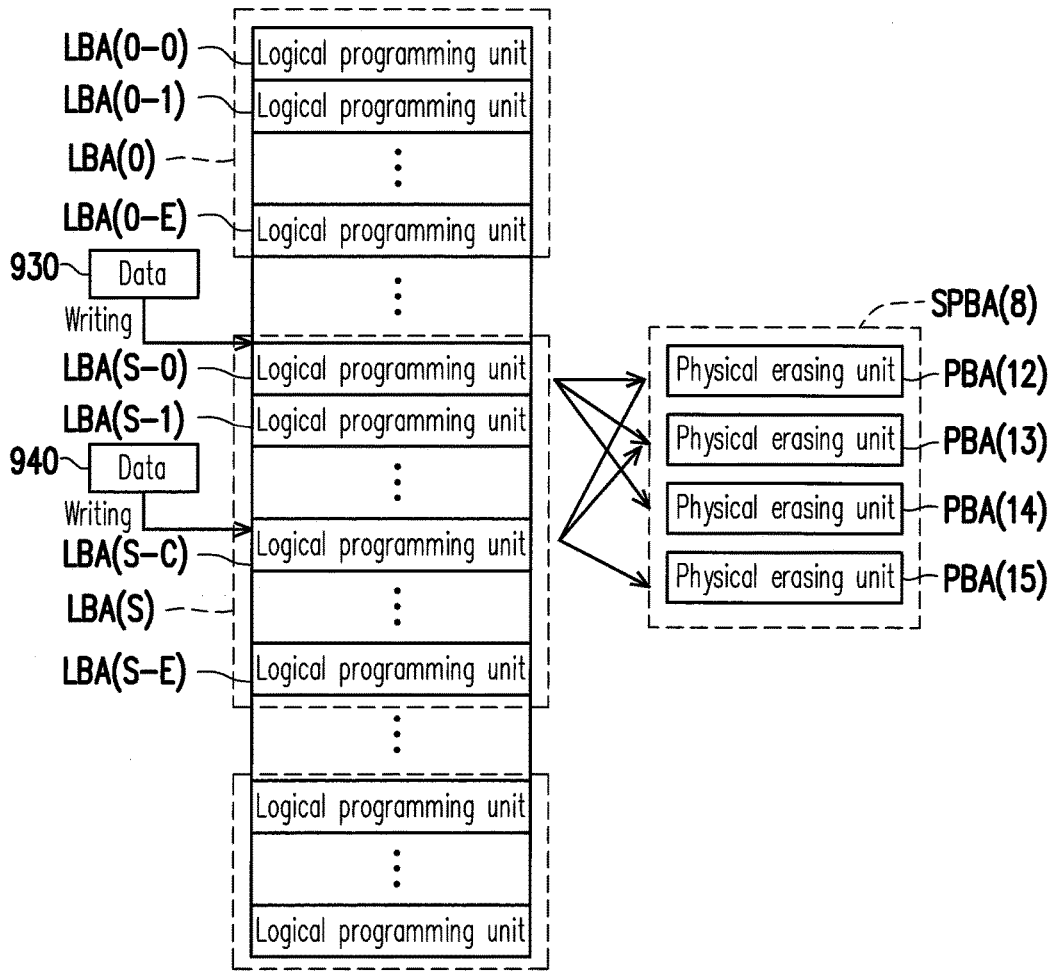
FIG. 9C is a schematic diagram illustrating an example for writing the data into the second type super physical unit according to the exemplary embodiment of FIG. 9A.

FIG. 9C is a schematic diagram illustrating an example for writing the data into the second type SPU according to the exemplary embodiment of FIG. 9A.

In this exemplary embodiment, one second type SPU includes the PEUs belonging to the same plane and the PEUs belonging to the different panes. In other words, for the second type SPU in this exemplary embodiment, two PEUs among the four PEUs mapped to one LEU belong to the same plane.

Referring to FIG. 9C, the LEU LBA(S) is mapped to the second type SPU SPBA(8). In the second type SPU SPBA(8), the PEU PBA(12) belongs to the plane P1, the PEU PBA(13) belongs to the plane P2 and the PEUs PBA(14) and PBA(15) belong to the plane P3. The host system 11 issues a write command which indicates to write data 930 into the LPU LBA(S-0). Assuming that the size of the data 930 is 16 KB, the MMC 502 divides the data 930 into four parts (i.e., a first part to a fourth part), where the size of each part is 4 KB. The MMC 502 issues at least one command sequence to program the first part and the second part of the data 930 into the PEUs PBA(12) and PBA(13) of the second type SPU SPBA(8), respectively, and write both the third part and the fourth part of the data 930 into the PEU PBA(14) of the second type SPU SPBA(8). For example, the MMC 502 programs the first part of the data 930 into a first PPU of the PEU PBA(12), writes the second part of the data 930 into a first PPU of the PEU PBA(13), and writes the third part and the fourth part of the data 930 into a first PPU and a second PPU of the PEU PBA(14). If the host system 11 further issues other write commands, the MMC 502 writes the data indicated by those write commands into the PEUs PBA(12), PBA(13) and PBA(14), respectively, until there is no spare PPU left in the PEU PBA(14). Next, if the MMC 502 receives one write command which indicates to write data 940 again, the MMC 502 writes the data 940 into the PEUs PBA(12), PBA(13) and PBA(15) of the second type SPU SPBA(8), respectively.

In other words, the PEUs PBA(12), PBA(13) and PBA(14) (or PBA(15)) of the second type SPU SPBA(8) may be simultaneously programmed with data since they belong to the different planes. Because the PEUs PBA(14) and PBA(15) of the second type SPU SPBA(8) belong to the same plane, the data is first programmed into the PEU PBA(14) during the writing operation. The data is only programmed into the PEU PBA(15) when there is no spare PPU left in the PEU PBA(14). Further, the PEUs PBA(14) and PBA(15) of the second type SPU SPBA(8) are programmed with data in a manner of one PPU after another PPU. However, the invention is not limited to the above. The PEUs PBA(14) and PBA(15) of the second type SPU SPBA(8) may also be programmed alternately.

It is noted that, the MMC 502 further configure each available PEU of the first type SPU as to be programmed based on one of a first programming mode and a second programming mode. On the other hand, the MMC 502 further configure each available PEU of the second type SPU as to be programmed only based on the first programming mode. For example, in one exemplar embodiment of FIG. 8A, each of the PEUs PBA(0), PBA(1), PBA(2), PBA(7), PBA(4), PBA(9), PBA(8) and PBA(15) can be configured as to be programmed based on the first programming mode or the second programming mode, while each of the PEUs PBA(10) and PBA(14) can only be configured as to be programmed based on the first programming mode. Alternatively, in one exemplar embodiment of FIG. 9A, each of the PEUs PBA(0) to PBA(11) can be configured as to be programmed based on the first programming mode or the second programming mode, while each of the PEUs PBA (12) to PBA(15) can only be configured as to be programmed based on the first programming mode.

In one exemplary embodiment, the first programming mode refers to one of a single layer memory cell (SLC) mode, a lower physical programming mode, a mixture programming mode and a less layer memory cell mode. In the single layer memory cell mode, one memory cell is only stored with data of one bit. In the lower physical programming mode, only the lower PPUs are programmed while the upper PPUs corresponding to the lower PPUs may not be programmed. In the mixture programming mode, valid data (or real data) are programmed into the lower PPUs while dummy data is programmed into the upper PPUs corresponding to the lower PPUs. In the less layer memory cell mode, one memory cell is stored with data of a first number of bits. For example, the first number may be set to "1".

In one exemplary embodiment, the second programming mode refers to a Multi level cell (MLC) programming mode, a Trinary level cell (TLC) programming mode or other similar modes. In the second programming mode, one memory cell is stored with data of a second number of bits, whereas the second number is equal or greater than "2". For example, the second number may be set to "2" or "3". In another exemplary embodiment, each of the first number and the second number may be other number as long as the second number is greater than the first number.

In one exemplary embodiment of FIG. 8A to FIG. 8C, it is assumed that the PEUs PBA(0) to PBA (15) are initially configured to be programmed based on the second programming mode (e.g., each memory cell of the PEUs PBA(0) to PBA (15) is initially configured to store 2 or 3 bits of data). After the configuration of the first type SPUs SPBA(0) to SPBA(3) is completed, in the operation of FIG. 8B, the PEUs PBA(0), PBA(1), PBA(2), PBA(7), PBA(4), PBA(9), PBA(8) and PBA(15) are maintained as to be programmed based on the second programming mode. However, after the configuration of the second type SPU SPBA(4) is completed, in the operation of FIG. 8C, the PEUs PBA(10) and PBA(14) are limited as to be programmed only based on the first programming mode.

It is noted that, in one exemplary embodiment, whether to configure one specific PEU as to be programmed only based on the first programming mode is determined according to whether this specific PEU currently belongs to the first type SPU (or the second type SPU). For example, it is assumed that one specific PEU initially belongs to the second type SPU, such that the specific PEU can only be programmed based on the first programming mode. If the specific PEU is rearranged to be included in the first type SPU, the specific PEU can be re-configured to be programmed based on the second programming mode. For example, in one exemplary embodiment of FIG. 8A, if the PEU PBA(4) included in the first type SPU SPBA(2) becomes a damaged PEU through usage, the PEU PBA(4) may be replaced by the PEU PBA(10), such that the first type SPU SPBA(2) includes the PEUs PBA(9) and PBA (10). In this case, because the PEU PBA(10) currently belongs to the first type SPU, the limitation that the PEU PBA(10) can only be programmed based on the first programming mode is removed. In other words, the PEU PBA(10) can be restored to be programmed based on a default programming mode of the PEU PBA(10), which may be the first programming mode or the second programming mode. Alternatively, if one specific PEU initially belongs to the first type SPU but switched to the second type SPU, the specific PEU is correspondingly limited as to be programmed only based on the first programming mode.

In one exemplary embodiment, if the specification of the memory storage device 10 includes that multiple open blocks operated in the second programming mode (e.g., the TLC programming mode) cannot exist in the same plane at the same time, said configuration of the second type SPU can still be compatible with the memory storage device 10. It is noted that, said open block(s) indicates the PEU(s) currently used for storing the data from the host system 11. For example, an open block may be a PEU selected from the spare area 604 of FIG. 6.

Figure 10:
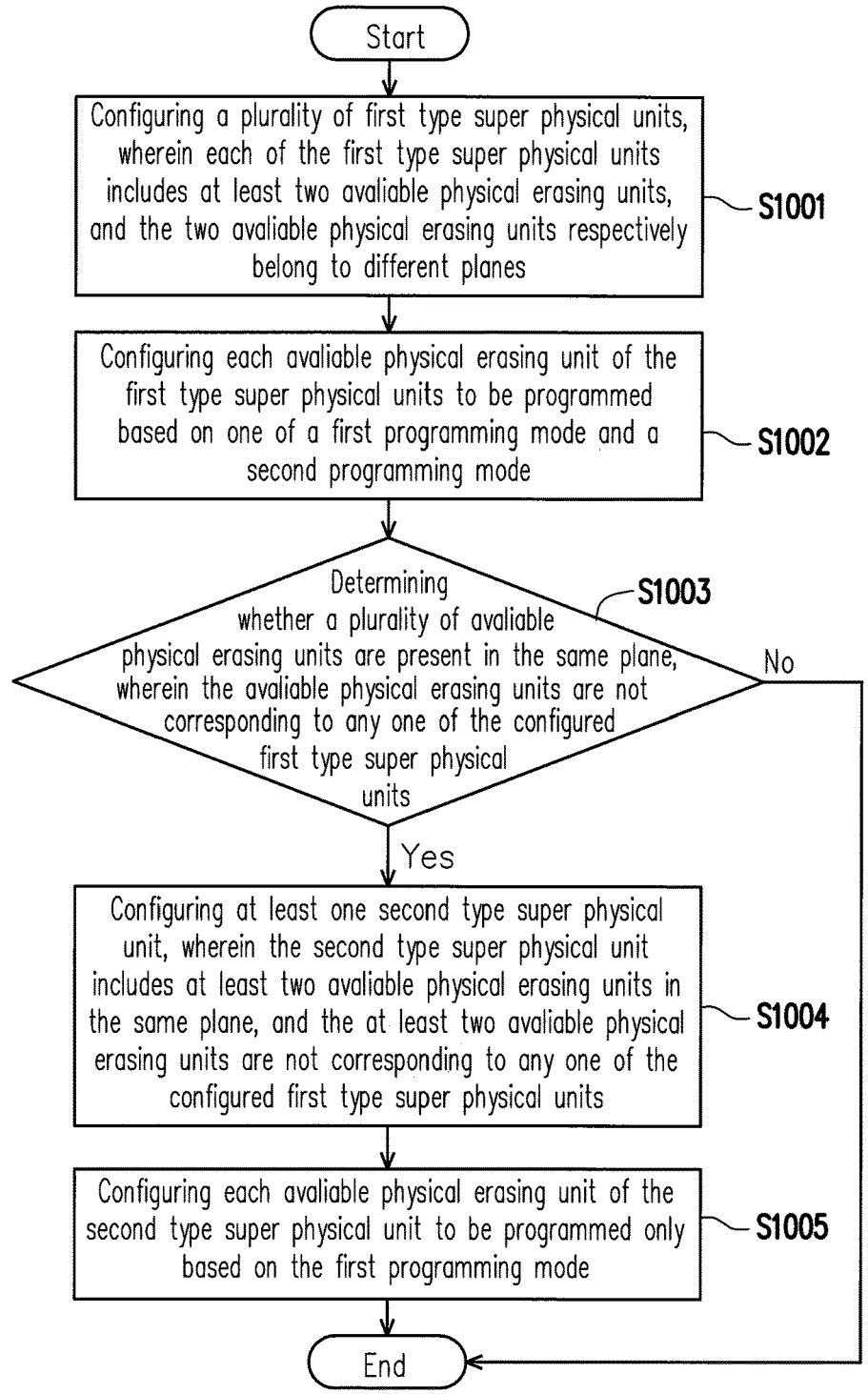
FIG. 10 is a flowchart illustrating the memory management method for configuring the super physical unit and the programming mode according to an exemplary embodiment.

FIG. 10 is a flowchart illustrating the memory management method for configuring the SPU and the programming mode according to an exemplary embodiment.

Referring to FIG. 10, in step S1001, the MMC 502 configures a plurality of first type SPUs, wherein each of the first type SPUs includes at least two available PEUs, and these two available PEUs respectively belong to different planes. In this exemplary embodiment, the MMC 502 can determine whether the available PEUs which may be configured as the first type SPU are present each plane. Further, step S1001 may be executed repeatedly if the available PEUs which may be configured as the first type SPU are still present in each of the planes. In step 1002, the MMC 502 configures each available PEU of the first type SPU as to be programmed based on one of the first programming mode and the second programming mode, depending on the default programming mode of different PEU.

In step S1003, the MMC 502 determines whether a plurality of available PEUs are present in the same plane, wherein the available PEUs are not corresponding to any one of the configured first type SPUs. In this exemplary embodiment, step S1003 may be executed when the available PEUs which can be configured as the first type SPU are not present in each of the planes. If the available PEUs not corresponding to any one of the configured first type SPUs are present in the same plane, in step S1004, the MMC 502 configures at least one second type SPU, wherein the second type SPU includes at least two available PEUs in the same plane, and the at least two available PEUs are not corresponding to any one of the configured first type SPUs. In this embodiment, the at least two available PEUs are the available PEUs which cannot be configured as the first type SPU.

Then, in step 1005, the MMC 502 configures each available PEU of the second type SPU as to be programmed only based on the first programming mode. In addition, if the available PEUs not corresponding to any one of the first type SPUs are not present in the same plane (e.g., the at least two available PEUs not corresponding to any one of the configured first type SPUs are not present in the same plane), the flow of configuring the SPU and the programming mode ends.

Figure 11:
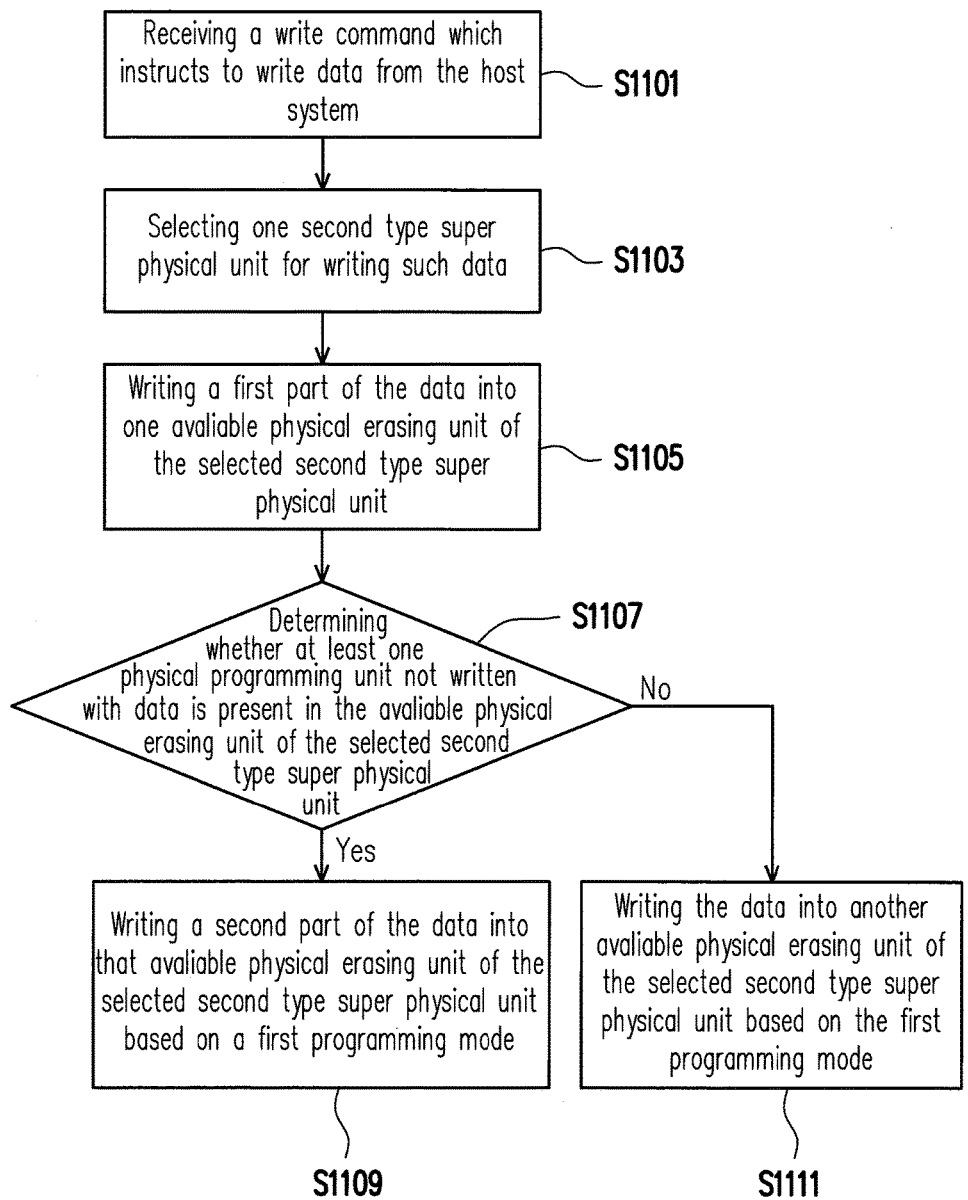
FIG. 11 is a flowchart illustrating the memory management method for writing data into the second type super physical unit according to an exemplary embodiment.

FIG. 11 is a flowchart illustrating the memory management method for writing data into the second type SPU according to an exemplary embodiment.

In step S1101, a write command which indicates to write data is received from the host system.

In step S1103, the MMC 502 selects one second type SPU for writing such data.

In step S1105, the MMC 502 writes a first part of the data into one available PEU of the selected second type SPU.

In step S1107, the MMC 502 determines whether at least one PPU not written with data (i.e., the spare PPU) is present in the available PEU of the selected second type SPU.

If the at least one PPU not written with data is present in the available PEU of the selected second type SPU, in step S1109, the MMC 502 writes a second part of the data into that available PEU of the selected second type SPU based on the first programming mode.

If the PPU not written with data is not present in the available PEU of the selected second type SPU, in step S1111, the MMC 502 writes the second part of the data into another available PEU of the selected second type SPU based on the first programming mode.

In another exemplary embodiment, before step S1105, the MMC 502 can temporarily store the data into a buffer area of a buffer memory. Moreover, aforesaid steps have been described in detail as the above, which is not repeated hereinafter.

In summary, other than the capability of using the available PEUs belonging to the different planes or dies to configure the SPU, the invention can also use the available PEUs belonging to the same plane or die to configure the SPU. In other words, the available PEUs which may not be configured as the first type SPU in the same plane or die may be used to configure the second type SPU. As a result, not only may the number of the configured SPUs be increased, the available PEUs in the RNVM module may also be utilized more efficiently. Furthermore, through configuring the PEU of the second type SPU as to be programmed only based on the first programming mode, the incompatible issue between the configuration of the second type SPU and some types of memory storage device can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory management method for a memory storage device, wherein the memory storage device comprises a rewritable non-volatile memory module having a plurality of available physical erasing units, the memory management method comprising:
    allocating a part of the available physical erasing units to configure a plurality of first type super physical units, wherein each of the first type super physical units at least comprises a first available physical erasing unit and a second available physical erasing unit, and the first available physical erasing unit and the second available physical erasing unit are simultaneously programmed;
    allocating another part of the available physical erasing units to configure at least one second type super physical unit, wherein one of the at least one second type super physical unit at least comprises a third available physical erasing unit and a fourth available physical erasing unit, and the third available physical erasing unit is programmed before the fourth available physical erasing unit is programmed;
    configuring each available physical erasing unit of the first type super physical units as to be programmed based on one of a first programming mode and a second programming mode; and
    configuring each available physical erasing unit of the at least one second type super physical unit as to be programmed only based on the first programming mode,
    wherein each memory cell of one available physical erasing unit programmed based on the first programming mode is configured to store a first number of data bit, each memory cell of one available physical erasing unit programmed based on the second programming mode is configured to store a second number of data bit, and the second number is larger than the first number.

2. The memory management method of claim 1, further comprising:
    receiving a first write command which indicates to write first data from a host system, wherein the first data comprises a first part and a second part;
    writing the first part of the first data into the third available physical erasing unit;
    writing the second part of the first data into the third available physical erasing unit if at least one physical programming unit of the third available physical erasing unit is not written with data after the first part of the first data is written into the third available physical erasing unit; and
    writing the second part of the first data into the fourth available physical erasing unit if all of the physical programming units of the third available physical erasing unit is written with data after the first part of the first data is written into the third available physical erasing unit.

3. The memory management method of claim 2, further comprising:
    configuring a plurality of logical addresses, wherein the first part of the first data belongs to at least one first logical address among the logical addresses, the second part of the first data belongs to at least one second logical address among the logical address, and the at least one second logical address is arranged after the at least one first logical address.

4. The memory management method of claim 3, wherein the logical addresses constitute a plurality of logical programming units, the logical programming units constitute a plurality of logical erasing units, and the at least one second type super physical unit is mapped to at least one of the logical erasing units.

5. The memory management method of claim 1, further comprising:
    receiving a first write command which indicates to write first data from a host system, wherein the first data comprises a first part and a second part;
    writing the first part of the first data into the third available physical erasing unit; and
    writing the second part of the first data into the fourth available physical erasing unit.

6. The memory management method of claim 1, further comprising:
    receiving a second write command which indicates to write second data from a host system, wherein the second data comprises a first part and a second part;
    writing the first part of the second data into the first available physical erasing unit of one of the first type super physical units; and
    writing the second part of the second data into the second available physical erasing unit of the one of the first type super physical units.

7. The memory management method of claim 1, wherein the first number is one, and the second number is three.

8. The memory management method of claim 1, wherein the one of the at least one second type physical erasing unit further comprises a fifth available physical erasing unit and a sixth available physical erasing unit,
wherein the memory management method further comprises:
receiving a third write command which indicates to write third data from a host system;
writing the third data into the fifth available physical erasing unit, the sixth available physical erasing unit and third available physical erasing unit;
receiving a fourth write command which indicates to write fourth data from the host system; and
writing the fourth data into the fifth available physical erasing unit, the sixth available physical erasing unit and fourth available physical erasing unit after the third data is written to the fifth available physical erasing unit, the sixth available physical erasing unit and third available physical erasing unit.

9. A memory control circuit unit for controlling a rewritable non-volatile memory module, wherein the rewritable non-volatile memory module has a plurality of available physical erasing units, the memory control circuit unit comprising:
a host interface configured to couple to a host system;
a memory interface configured to couple to the rewritable non-volatile memory module; and
a memory management circuit coupled to the host interface and the memory interface,
wherein the memory management circuit is configured to allocate a part of the available physical erasing units to configure a plurality of first type super physical units, wherein each first type super physical unit among the first type super physical units at least comprises a first available physical erasing unit and a second available physical erasing unit, and the first available physical erasing unit and the second available physical erasing unit are simultaneously programmed,
wherein the memory management circuit is further configured to allocate another part of the available physical erasing units to configure at least one second type super physical unit, wherein one of the at least one second type super physical unit at least comprises a third available physical erasing unit and a fourth available physical erasing unit, and the third available physical erasing unit is programmed before the fourth available physical erasing unit is programmed,
wherein the memory management circuit is further configured to configure each available physical erasing unit of the first type super physical units as to be programmed based on one of a first programming mode and a second programming mode,
wherein the memory management circuit is further configured to configure each available physical erasing unit of the at least one second type super physical unit as to be programmed only based on the first programming mode,
wherein each memory cell of one available physical erasing unit programmed based on the first programming mode is configured to store a first number of data bit, each memory cell of one available physical erasing unit programmed based on the second programming mode is configured to store a second number of data bit, and the second number is larger than the first number.

10. The memory control circuit unit of claim 9, wherein the memory management circuit is further configured to receive a first write command which indicates to write first data from the host system, wherein the first data comprises a first part and a second part,
wherein the memory management circuit is further configured to issue a first command sequence to write the first part of the first data into the third available physical erasing unit,
wherein the memory management circuit is further configured to issue a second command sequence to write the second part of the first data into the third available physical erasing unit if at least one physical programming unit of the third available physical erasing unit is not written with data after the first part of the first data is written into the third available physical erasing unit,
wherein the memory management circuit is further configured to issue a third command sequence to write the second part of the first data into the fourth available physical erasing unit if all of the physical programming units of the third available physical erasing unit is written with data after the first part of the first data is written into the third available physical erasing unit.

11. The memory control circuit unit of claim 10, wherein the memory management circuit is further configured to configure a plurality of logical addresses, wherein the first part of the first data belongs to at least one first logical address among the logical addresses, the second part of the first data belongs to at least one second logical address among the logical address, and the at least one second logical address is arranged after the at least one first logical address.

12. The memory control circuit unit of claim 11, wherein the logical addresses constitute a plurality of logical programming units, the logical programming units constitute a plurality of logical erasing units, and the at least one second type super physical unit is mapped to at least one of the logical erasing units.

13. The memory control circuit unit of claim 9, wherein the memory management circuit is further configured to receive a first write command which indicates to write first data from the host system, wherein the first data comprises a first part and a second part,
wherein the memory management circuit is further configured to issue a first command sequence to write the first part of the first data into the third available physical erasing unit,
wherein the memory management circuit is further configured to issue a second command sequence to write the second part of the first data into the fourth available physical erasing unit.

14. The memory control circuit unit of claim 9, wherein the memory management circuit is further configured to receive a second write command which indicates to write second data from the host system, wherein the second data comprises a first part and a second part,
wherein the memory management circuit is further configured to issue a first command sequence to write the first part of the second data into the first available physical erasing unit of one of the first type super physical units,
wherein the memory management circuit is further configured to issue a second command sequence to write the second part of the second data into the second available physical erasing unit of the one of the first type super physical units.

15. The memory control circuit unit of claim 9, wherein the first number is one, and the second number is three.

16. The memory control circuit unit of claim 9, wherein the one of the at least one second type physical erasing unit further comprises a fifth available physical erasing unit and a sixth available physical erasing unit, wherein the memory management circuit is further configured to receive a third write command which indicates to write third data from the host system, wherein the memory management circuit is further configured to issue a third command sequence to write the third data into the fifth available physical erasing unit, the sixth available physical erasing unit and third available physical erasing unit, wherein the memory management circuit is further configured to receive a fourth write command which indicates to write fourth data from the host system, wherein the memory management circuit is further configured to issue a fourth command sequence to write the fourth data into the fifth available physical erasing unit, the sixth available physical erasing unit and fourth available physical erasing unit after the third data is written to the fifth available physical erasing unit, the sixth available physical erasing unit and third available physical erasing unit.

17. A memory storage device, comprising:

a connection interface unit configured to couple to a host system;

a rewritable non-volatile memory module comprising a plurality of available physical erasing units; and a memory control circuit unit, coupled to the connection interface unit and the rewritable non-volatile memory module, wherein the memory control circuit unit is configured to allocate a part of the available physical erasing units to configure a plurality of first type super physical units, wherein each first type super physical unit among the first type super physical units at least comprises a first available physical erasing unit and a second available physical erasing unit, and the first available physical erasing unit and the second available physical erasing unit are simultaneously programmed, wherein the memory control circuit unit is further configured to allocate another part of the available physical erasing units to configure at least one second type super physical unit, wherein one of the at least one second type super physical unit at least comprises a third available physical erasing unit and a fourth available physical erasing unit, and the third available physical erasing unit is programmed before the fourth available physical erasing unit is programmed wherein the memory control circuit unit is further configured to configure each available physical erasing unit of the first type super physical units as to be programmed based on one of a first programming mode and a second programming mode, wherein the memory control circuit unit is further configured to configure each available physical erasing unit of the at least one second type super physical unit as to be programmed only based on the first programming mode, wherein each memory cell of one available physical erasing unit programmed based on the first programming mode is configured to store a first number of data bit, each memory cell of one available physical erasing unit programmed based on the second programming mode is configured to store a second number of data bit, and the second number is larger than the first number.

18. The memory storage device of claim 17, wherein the memory control circuit unit is further configured to receive a first write command which indicates to write first data from the host system, wherein the first data comprises a first part and a second part, wherein the memory control circuit unit is further configured to issue a first command sequence to write the first part of the first data into the third available physical erasing unit, wherein the memory control circuit unit is further configured to issue a second command sequence to write the second part of the first data into the third available physical erasing unit if at least one physical programming unit of the third available physical erasing unit is not written with data after the first part of the first data is written into the third available physical erasing unit, wherein the memory control circuit unit is further configured to issue a third command sequence to write the second part of the first data into the fourth available physical erasing unit if all of the physical programming units of the third available physical erasing unit is written with data after the first part of the first data is written into the third available physical erasing unit.

19. The memory storage device of claim 18, wherein the memory control circuit unit is further configured to configure a plurality of logical addresses, wherein the first part of the first data belongs to at least one first logical address among the logical addresses, the second part of the first data belongs to at least one second logical address among the logical address, and the at least one second logical address is arranged after the at least one first logical address.

20. The memory storage device of claim 19, wherein the logical addresses constitute a plurality of logical programming units, the logical programming units constitute a plurality of logical erasing units, and the at least one second type super physical unit is mapped to at least one of the logical erasing units.

21. The memory storage device of claim 17, wherein the memory control circuit unit is further configured to receive a first write command which indicates to write first data from the host system, wherein the first data comprises a first part and a second part, wherein the memory control circuit unit is further configured to issue a first command sequence to write the first part of the first data into the third available physical erasing unit, wherein the memory control circuit unit is further configured to issue a second command sequence to write the second part of the first data into the fourth available physical erasing unit.

22. The memory storage device of claim 17, wherein the memory control circuit unit is further configured to receive a second write command which indicates to write second data from the host system, wherein the second data comprises a first part and a second part, wherein the memory control circuit unit is further configured to issue a first command sequence to write the first part of the second data into the first available physical erasing unit of one of the first type super physical units, wherein the memory control circuit unit is further configured to issue a second command sequence to write the second part of the second data into the second available physical erasing unit of the one of the first type super physical units.

23. The memory storage device of claim 17, wherein the first number is one, and the second number is three.

24. The memory storage device of claim 17, wherein the one of the at least one second type physical erasing unit further comprises a fifth available physical erasing unit and a sixth available physical erasing unit,
  wherein the memory control circuit unit is further configured to receive a third write command which indicates to write third data from the host system,
  wherein the memory control circuit unit is further configured to issue a third command sequence to write the third data into the fifth available physical erasing unit, the sixth available physical erasing unit and third available physical erasing unit,
  wherein the memory control circuit unit is further configured to receive a fourth write command which indicates to write fourth data from the host system,
  wherein the memory control circuit unit is further configured to issue a fourth command sequence to write the fourth data into the fifth available physical erasing unit, the sixth available physical erasing unit and fourth available physical erasing unit after the third data is written to the fifth available physical erasing unit, the sixth available physical erasing unit and third available physical erasing unit.

\* \* \* \* \*